United States Patent [19]

Miller, Jr. et al.

[11] Patent Number: 5,557,620
[45] Date of Patent: Sep. 17, 1996

[54] QUIESCENT CURRENT TESTING OF DYNAMIC LOGIC SYSTEMS

[75] Inventors: Robert H. Miller, Jr., Loveland; Craig A. Heikes, Fort Collins, both of Colo.

[73] Assignee: Hewlett-Packard Company, Palo Alto, Calif.

[21] Appl. No.: 533,415

[22] Filed: Sep. 25, 1995

Related U.S. Application Data

[63] Continuation of Ser. No. 177,826, Jan. 5, 1994, abandoned.

[51] Int. Cl.[6] .................................................. G06F 11/00
[52] U.S. Cl. ................................... 371/22.5; 371/22.6
[58] Field of Search ........................... 324/73.1, 158 R; 371/22.1, 22.2, 22.5, 22.6

[56] References Cited

U.S. PATENT DOCUMENTS 5,057,774 10/1991 Verhelst et al. .......................... 324/158
5,410,551 4/1995 Edwards et al. ........................ 371/25.1

OTHER PUBLICATIONS

EPO Search Report cited reference: Inspec Abstract No. B9408–1265B–039, C9408–5210–015 and IEEE Transactions On VLSI Systems, vol. 2, No. 2, pp. 241–248 (see abstract).

EPO Search Report cited reference: Inspec Abstract No. B9308–1265B–079 C9308–5210–035 and proceedings ATS 1992, pp. 64–69 (see abstract).

*Primary Examiner*—Vincent P. Canney
*Attorney, Agent, or Firm*—Augustus W. Winfield

[57] ABSTRACT

A system and method for quiescent current testing of dynamic logic circuitry. Nodes shorted to ground are detected during a dynamic pre-charge state. Nodes shorted to a power supply potential are detected by driving all nodes of interest to ground during a dynamic evaluation phase. Nodes of interest are driven to ground directly by one additional transistor per node or indirectly by logical propagation from upstream nodes. As a result, only two current measurements are needed for all shorted node faults, even for pipelined systems with multiple clocks. There is no need for input test signal sequences and no need for signal propagation to outputs for detection. Specific embodiments are provided for single-rail logic, single-rail pipelined systems, dual-rail logic and dual-rail pipelined systems. For single-rail pipelined systems, optional transistors between stages enable preservation of logical states during testing. For dual-rail logic, storage nodes and static nodes are forced to a logical state that is not possible during normal operation. For pipelined dual-rail logic, testing of alternate stages inherently preserves the logical state of the system during testing.

19 Claims, 16 Drawing Sheets

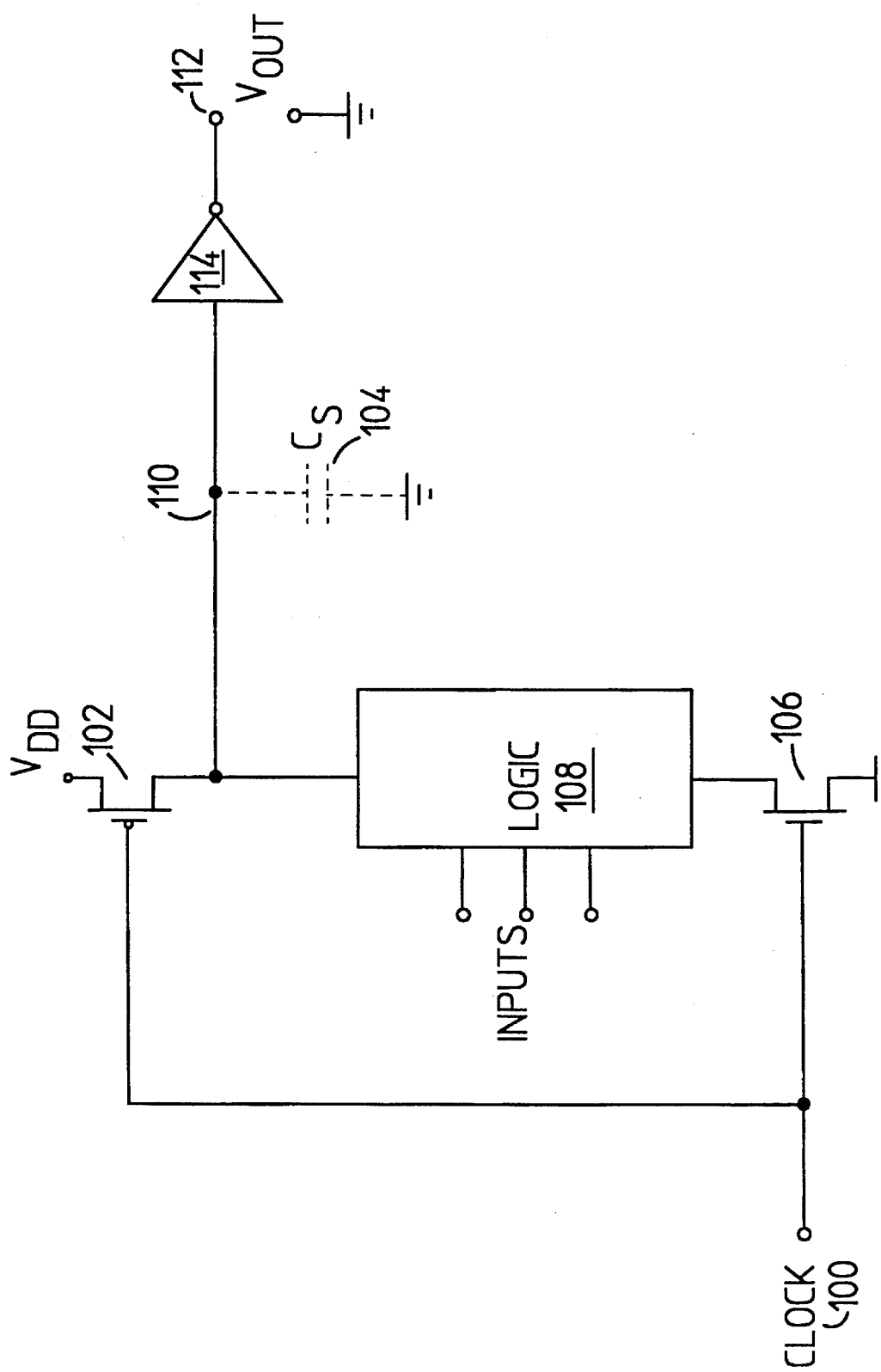

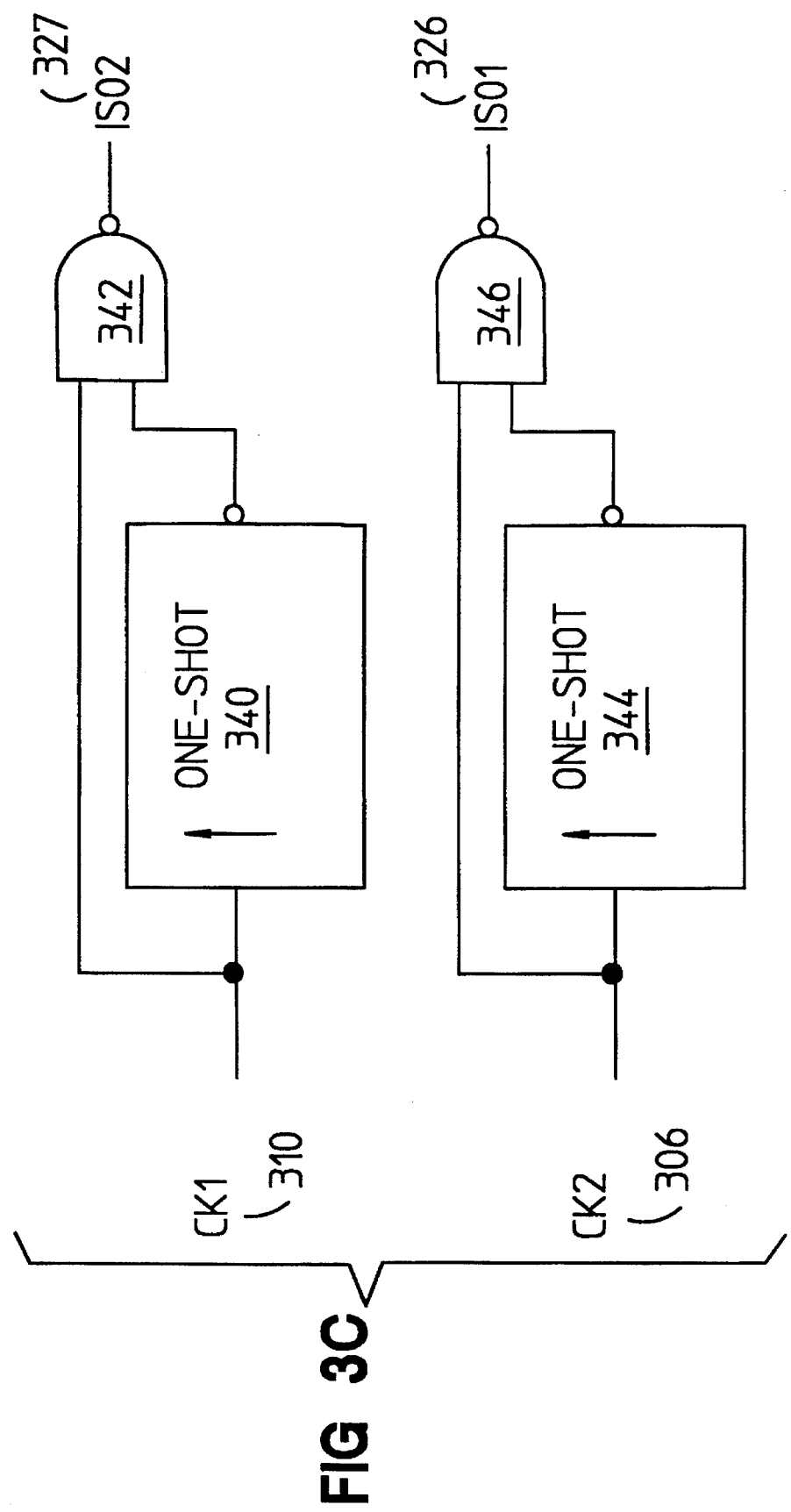

| $X_H$ | $X_L$ | STATE |
|---|---|---|
| 0 | 0 | INVALID (PRE-CHARGE) |
| 0 | 1 | VALID FALSE |
| 1 | 0 | VALID TRUE |
| 1 | 1 | ILLEGAL (FLUSH) |

FIG 4B

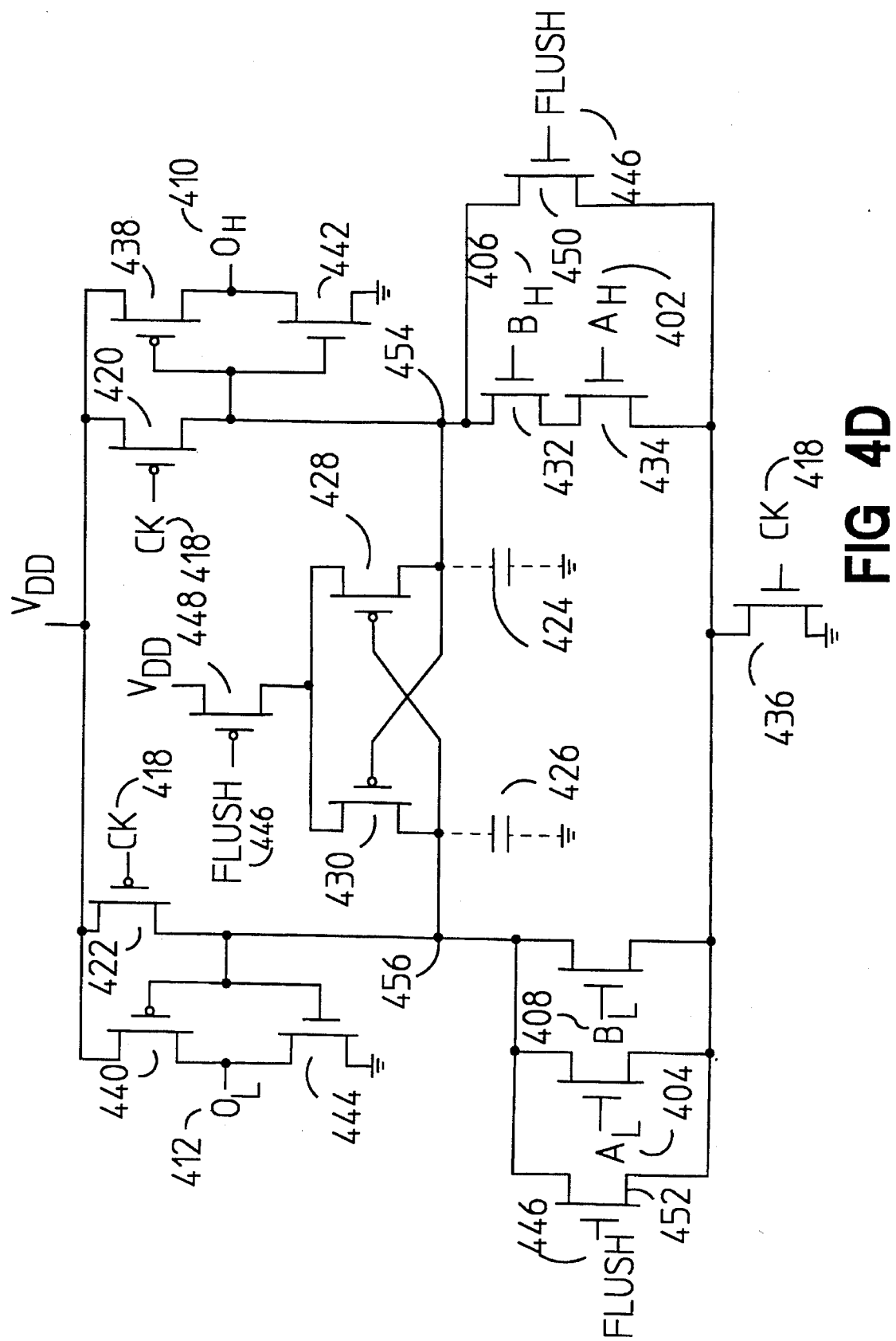

QUIESCENT CURRENT TESTING OF DYNAMIC LOGIC SYSTEMS

CROSS REFERENCE TO RELATED APPLICATION

This is a continuation of application Ser. No. 08/177,826 filed on Jan. 5, 1994, now abandoned.

FIELD OF INVENTION

This invention relates generally to integrated circuit testing and design for testability and more specifically to testing for faults in dynamic logic circuitry by monitoring the quiescent power supply current.

BACKGROUND OF THE INVENTION

During the manufacturing of digital integrated circuits, a manufacturing defect may result in an unintentional resistive path between different signal nodes, between a signal node and a power supply node, or between a signal node and ground. One common test approach is to apply sequences of logical input signals and monitor the resulting output signals. As complexity grows, however, it becomes increasingly difficult to find an input signal sequence that correctly exercises all internal nodes of interest and that guarantees that an internal node fault will propagate to an output for detection. In addition, a node defect may not be detectable as a logical fault. For example, as a result of a resistive or shorted node, circuitry may simultaneously pull-up and pull-down the node. The result of the conflicting conductances may be an intermediate voltage that may or may not induce logic errors. Conflicting conductances may, however, result in a detectable increase in power supply current. For example, if a node is shorted to ground and a gate attached to the shorted node attempts to drive the shorted node to a supply voltage (or conversely, if a node is shorted to a supply voltage and a gate attempts to drive the shorted node to ground), the shorted node may cause a detectable increase in the current drawn by the integrated circuit. If the current change is detectable, the node fault may be detectable without having to propagate the fault to an output node. In addition, the node fault may be detectable even if no logical error is induced. Testing based on detecting an increase in power supply current is called quiescent current testing or IDDQ testing. For a collection of articles providing general background information, see Y. K. Malaiya and R. Rajsuman, *Bridging Faults and IDDQ Testing*, IEEE Computer Society Press, 1992.

In general, even though quiescent current testing may eliminate the need to propagate logical faults to output terminals, there is still a need to ensure that all nodes are driven both high and low during current testing. In general, multiple input signal sequences and many current tests are needed to test all nodes of interest. There is a need for a quiescent current test that ensures that all nodes of interest are driven both high and low during current testing without requiring propagation of sequences of input signals. There is a need for minimizing the number of current tests required.

As the term "quiescent" implies, quiescent current measurement must be performed at a time when transient currents have stabilized. Quiescent current testing is typically limited to static logic circuitry in which the system clock can be paused, in which there is negligible static current and in which at any given time every node is always actively driven to a supply voltage or to ground. Dynamic logic circuits typically store a logic level temporarily as a voltage on a charged node capacitance. The node capacitance charge must be periodically refreshed or the node capacitance may float to an intermediate voltage. Generally, for dynamic logic circuits, a current measurement requires a longer time than the refresh time for the dynamic logic. If the system clock is paused for dynamic logic circuits, internal nodes may float to intermediate levels that can cause multiple downstream transistors to turn on such that opposing transistors may attempt to simultaneously drive a node to a supply voltage and to ground. This may cause an increase in overall current which is not caused by a node fault. There is a need for a method of quiescent current testing in dynamic logic circuitry which is not affected by voltage drift during a paused clock period.

A general goal of integrated circuit testing is to complete the test as rapidly as possible to minimize manufacturing costs. Complex integrated circuits may require a significant amount of time to initialize the circuitry or to otherwise drive the circuitry to a known state. A quiescent current test may alter the logical state of the circuitry being tested which in turn may require a new initialization process after the quiescent current test is complete. Therefore, a quiescent current testing solution is desirable that preserves the dynamic logic states.

SUMMARY OF THE INVENTION

The present invention provides a quiescent current test for dynamic logic circuitry with the following advantages and features:

1. Only two power supply current measurements are needed for all low impedance faults at nodes, even for pipelined systems.
2. There is no need for input test signal sequences to propagate logical test vectors to tested nodes.
3. There is no need for signal propagation to outputs for detection.
4. During testing, all dynamic nodes are actively driven to a power supply potential or to ground so there is no drifting of dynamic node voltages during testing, even if the system clock is paused indefinitely.
5. In a cascade of gates, not all gates need additional test circuitry.
6. Pipelined embodiments are provided in which the logical state of the circuity is preserved during the quiescent current test.

Specific embodiments are provided for dynamic single-rail domino logic, single-rail pipelined systems, dual-rail (mousetrap) logic and dual-rail pipelined systems. For non-pipelined systems, a first current measurement is made during a dynamic pre-charge phase during which all dynamic nodes are precharged high. As a result, the first current measurement detects dynamic nodes that are shorted or driven to ground. For nonpipelined systems, a second current measurement is made during the dynamic evaluation phase. During the second current measurement, all dynamic nodes of interest are forced to ground directly by special test circuitry or indirectly as a result of logic state propagation from upstream gates. As a result, the second current measurement detects dynamic nodes that are shorted or driven to a power supply.

For pipelined systems, alternating stages have alternating precharge/evaluate phases so that one current measurement detects nodes shorted to ground in some stages and nodes shorted to the power supply in the remaining stages. A second current measurement measures the complementary phase of each stage. Therefore, even for pipelined systems, only two current measurements are required.

If a single-rail logic gate must be directly forced low by a test signal, one additional transistor on the internal storage node forces the storage node low during the dynamic evaluation phase. For single-rail pipelined systems, optional transistors between stages enable preservation of logical states during testing. For dual-rail logic, for both dynamic logic gates and static latches, additional transistors force storage nodes or latched nodes to a logical state that is not possible during normal operation. For pipelined dual-rail logic, the logical state of the system is inherently preserved during quiescent testing by staggering the test signal among alternate stages.

BRIEF DESCRIPTION OF THE DRAWINGS

FIG. 1A is a simplified schematic of a single-rail domino dynamic logic gate.

FIG. 3C is a schematic illustrating one embodiment for generating signals illustrated in FIG. 3B for isolation of stages during testing.

FIG. 4B is a chart of possible states for the mousetrap logic gate of FIG. 4A.

FIG. 4D is a schematic of the mousetrap gate illustrated in FIG. 4C adapted for quiescent current testing in accordance with the present invention.

DETAILED DESCRIPTION OF THE PREFERRED EMBODIMENT OF THE INVENTION

Figure 1B:
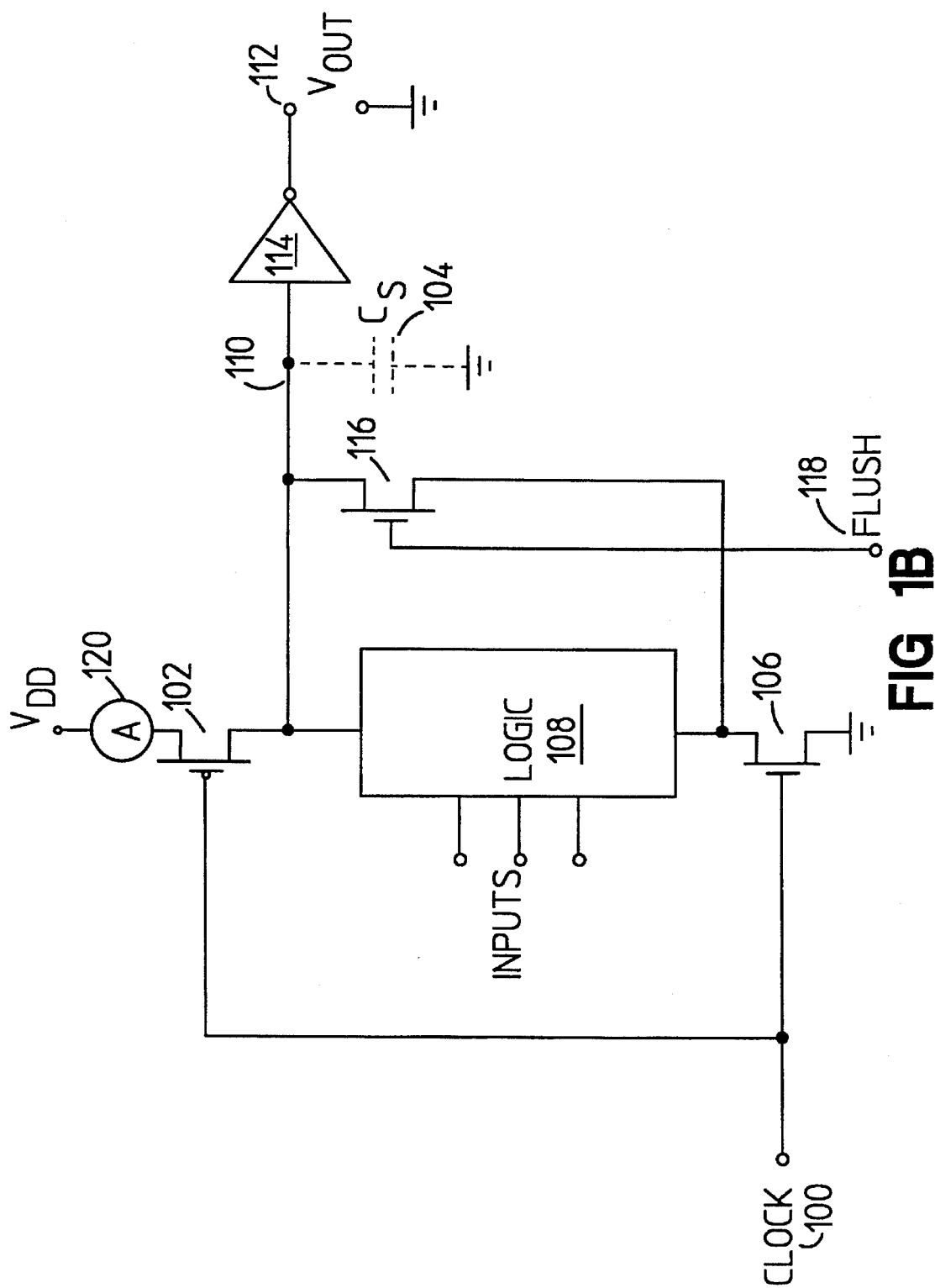
FIG. 1B is a schematic of the dynamic logic gate of FIG. 1A adapted for quiescent current testing in accordance with the present invention.

FIG. 1A illustrates a simplified MOS single-rail domino dynamic logic gate. The term "single-rail" means that logical TRUE or FALSE is determined by whether a single storage node (110) is high or low. In contrast, dual-rail gates have two storage nodes and generalized "mouse-trap" gates may have an arbitrary number of storage nodes. The term "domino" means that the gate has an inverting buffer (114) on the output.

In FIG. 1A, when clock 100 is low (precharge phase), transistor 102 charges the storage node capacitance 104 to the supply voltage $V_{DD}$. When clock 100 is high (evaluation phase), transistor 106 conditionally discharges the storage node capacitance 104 depending on the logical combinational state of logic circuitry 108. If the storage node 110 is shorted to ground or has a low resistance to ground or to the output node 112, the circuit in FIG. 1A will draw an abnormally high power supply current during the precharge phase (clock 100 is low, transistor 102 is conducting). If the storage node 110 is shorted to the power supply $V_{DD}$ or has low resistance to $V_{DD}$, and the state of the combinational logic 108 is such that the storage node capacitance 104 is supposed to be discharged ($V_{OUT}$ 112 is supposed to be high), the circuit in FIG. 1A will draw an abnormally high power supply current during the evaluation phase (clock 100 is high).

Typically, in order to test a complex combination of dynamic gates for storage nodes shorted to the power supply, external input signals must be generated and propagated to internal logic circuitry in a manner which guarantees that for every storage node of interest, at some time during the testing period, the internal inputs to the logic circuitry corresponding to the node of interest will cause the node capacitance to be discharged. In addition, if the clock 100 is paused more than a few micro-seconds for current measurement, storage nodes 110 which are not being pulled low may drift to intermediate values, which in some circuit designs can cause increased current flow due to conflicting pull-up and pull-down circuitry in downstream logic. For example, inverter 114 is typically a static inverter having pull-up and pull-down circuitry. An intermediate voltage on storage node 110 may cause inverter 114 to draw excessive current (i.e., "drive fight").

FIG. 1B illustrates an embodiment of the present invention implementing quiescent current testing of the simplified dynamic gate illustrated in FIG. 1A. In FIG. 1B, a single test transistor 116 is added to every storage node that must be forced low directly by a test signal. As will be seen below in the discussion of FIG. 2, in a cascade of gates, test transistors 116 are not required in all gates. All test transistors 116 are driven by a single external signal designated FLUSH (118). When the flush signal 118 is asserted, and the dynamic circuitry is in the evaluate state (clock 100 is high), every storage node to be tested is pulled low either directly by a corresponding test transistor 116 or indirectly as a result of upstream storage nodes being pulled low. If any storage node is shorted to the power supply, a detectable increase in power supply current (as measured by ammeter 120) will be drawn through the corresponding test transistor 116 or through transistor 106 during the evaluation phase. As with FIG. 1A, storage nodes shorted to ground are detectable by an increase in power supply current during the precharge phase. Therefore, with the addition of transistors 116 and the flush signal 118, all shorted storage node testing may be completed in a single precharge/evaluation cycle. There is no need for input test signal sequences and propagation of test signals to outputs. In addition, the clock 100 can be paused for arbitrarily long periods to make the current measurements without any drift of storage node voltages because every storage node is either actively pulled high (transistor 102) during the precharge phase or is actively pulled low (test transistor 116 or transistor 106) during the evaluation phase.

In FIG. 1B, one side of transistor 116 is attached to one side of transistor 106. This arrangement conveniently gates the flush signal 118 with the clock signal 100 so that the flush signal 118 causes a low impedance to ground only when the clock 100 is high (evaluation phase). The transistor 116 could also be connected directly to ground provided that the flush signal 118 is asserted only during the evaluation phase.

For cascaded gates, upstream gates can force downstream gates to always evaluate to logical TRUE (logic 108) so that downstream storage nodes are forced low by transistor 106. If the inputs to a particular gate are guaranteed to go high during the evaluation phase, a flush transistor 116 is not necessary for that particular gate. For example, consider the cascaded domino logic gates illustrated in FIG. 2. If gates 202, 204, and 206 can be guaranteed or forced to evaluate high (storage node discharged), then gates 208 and 210 can be guaranteed to evaluate high. In general, for a network of domino logic gates, if the storage nodes of all gates connected to the network inputs 200 are forced low, or if all the inputs 200 to the network can be forced high, then storage nodes in all downstream gates will be forced low indirectly. The previous statement would not be true for EXCLUSIVE-OR gates. Domino logic, however, is not functionally complete and completely dynamic EXCLUSIVE-OR domino logic gates cannot be implemented (the EXCLUSIVE-OR function can be implemented if one input is static during the precharge phase of the other input). Therefore, for domino logic as illustrated by the example in FIG. 2, flush transistors are required only on gates 202, 204, and 206 and only if inputs to these gates cannot be guaranteed to be high. If all inputs 200 are forced high, no flush transistors are needed.

Figure 3A:
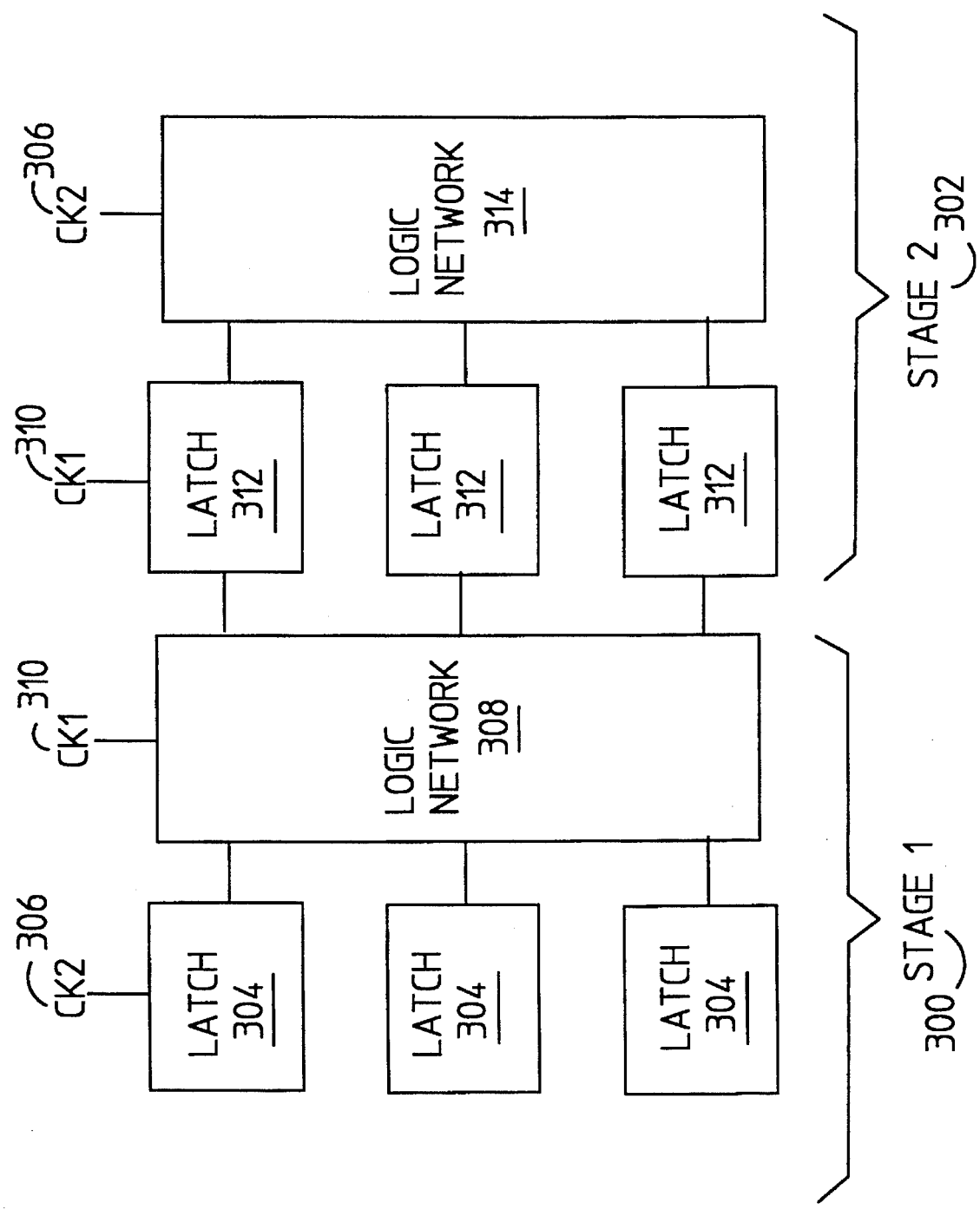
FIG. 3A is a block diagram schematic of a pipelined single-rail dynamic logic system.
Figure 3B:
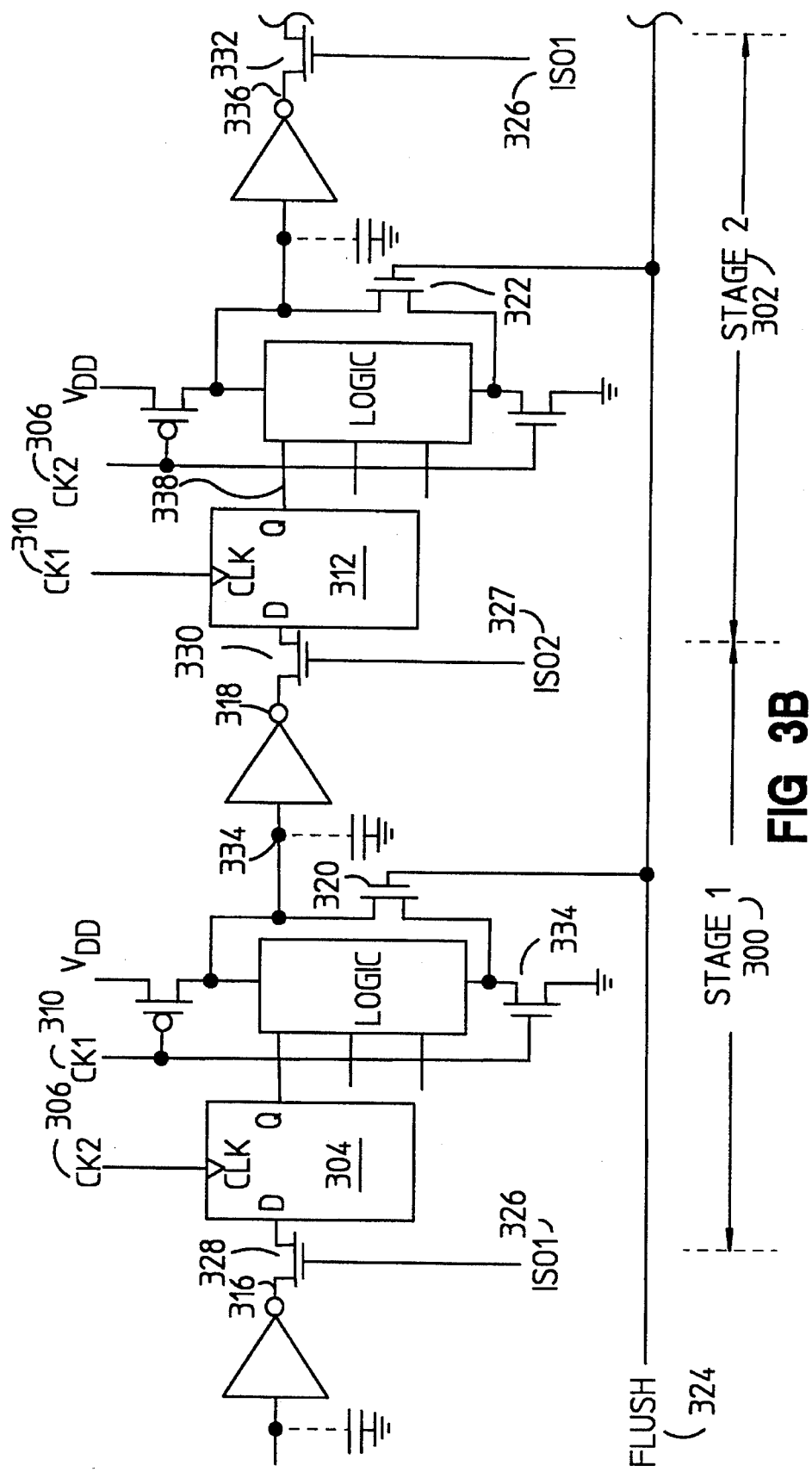
FIG. 3B is a schematic illustrating additional detail for part of the pipelined system of FIG. 3A.
Figure 3D:
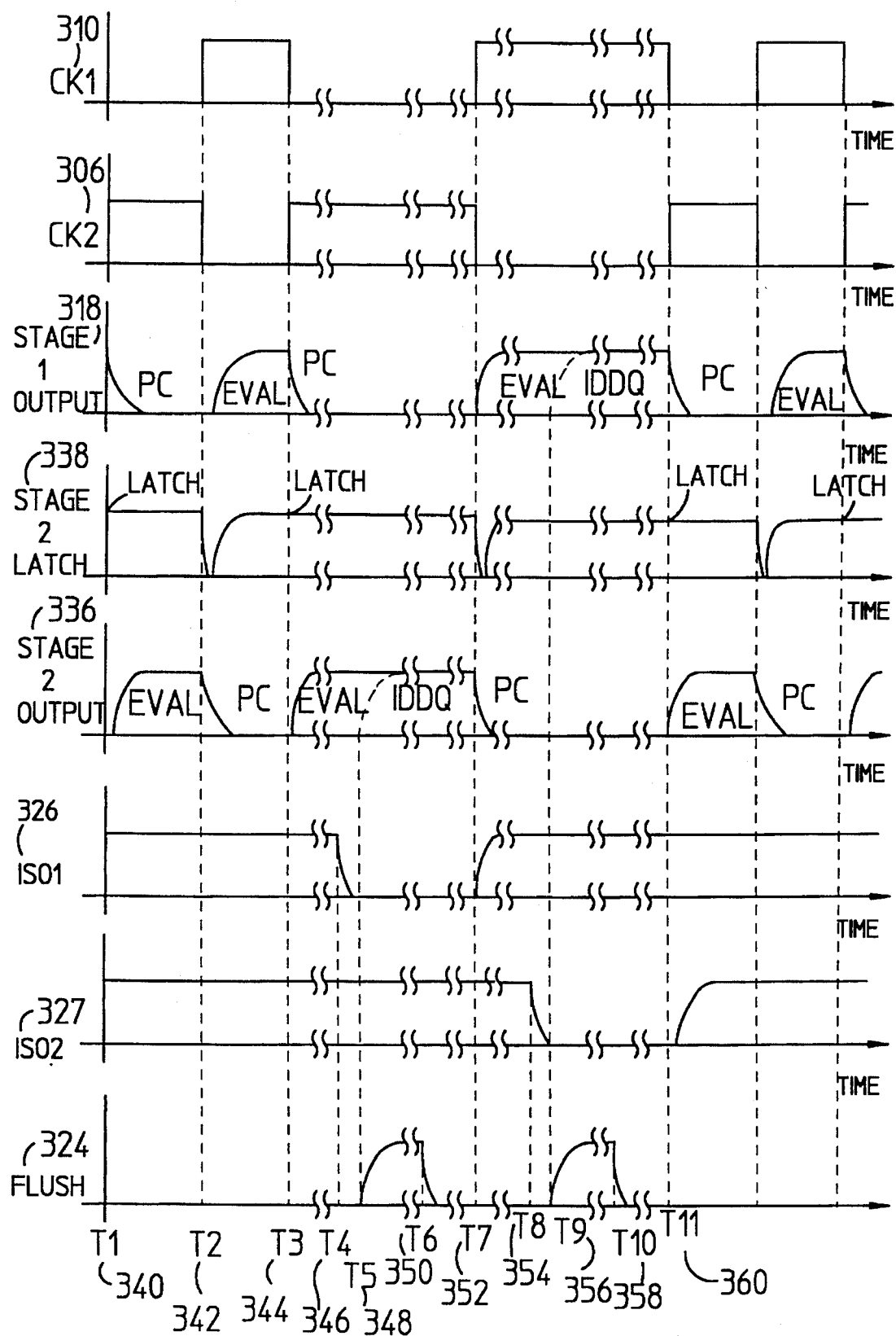
FIG. 3D is a timing diagram for the pipelined system of FIGS. 3A through 3D.

Microprocessors, multiplication circuits and other high performance circuits often perform long sequences of operations requiring multiple clock cycles. A general design approach to improving the performance of sequential operations is to permit overlapping operations, which is called pipelining. With pipelining, new operations or data are introduced before earlier operations have completed a sequence. FIG. 3A is a block diagram illustrating a sequence of pipelined logic stages. FIG. 3B illustrates additional circuit detail for a portion of the pipelined logic stages of FIG. 3A. FIG. 3C illustrates circuitry for generating signals needed for isolation between stages. FIG. 3D illustrates a timing diagram for precharge, evaluation and testing of alternate states.

FIG. 3A illustrates 2 stages (300, 302) of a simplified dynamic pipelined system. Pipelining with dynamic logic requires preservation of some states during precharge phases. One general approach to pipelining with dynamic logic is to modify the clocking of alternate stages so that some stages are precharging while others are evaluating. Stage 1 (300) consists of a group of latches 304 all clocked by a common clock CK2 (306) and a network of domino logic gates 308 all clocked by a second common clock CK1 (310). Stage 2 (302) consists of a group of latches 312 clocked by clock CK1 (310) and a network of domino logic gates 314 all clocked by clock CK2 (306). Latches 304 preserve the logic state for the logic network 308 while the logic network 308 is in the precharge phase and latches 312 preserve the logic state for the logic network 314 while the logic network 314 is in the precharge phase. The clocks CK1 (310) and CK2 (306) are staggered so that the logic network 314 of stage 2 (302) is in the precharge phase while the logic network 308 of stage 1 (300) is in the evaluate phase and vice-versa. For the system illustrated in FIGS. 3A–3D, CK1 (310) and CK2 (306) are each symmetrical and are complements of each other (see FIG. 3D). Other pipelined designs may have asymmetrical overlapping clocks.

Figure 2:
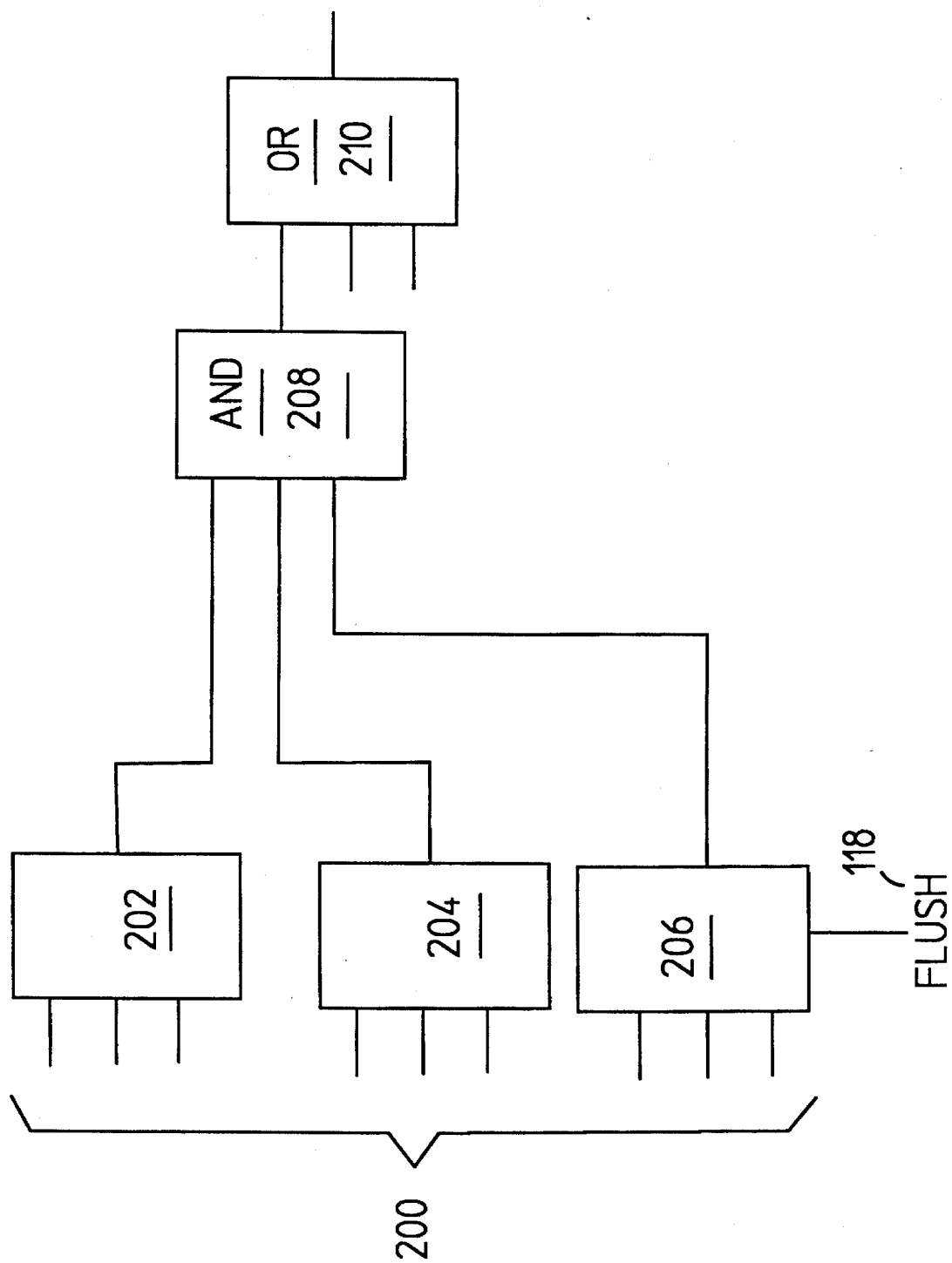
FIG. 2 is a logic diagram of cascaded domino logic gates.

FIG. 3B illustrates additional detail for the pipelined system of FIG. 3A. In FIG. 3B, each stage is depicted with a single domino logic gate and a single latched input to simplify the explanation. In general, however, each stage may have a complex arrangement of cascaded gates (as illustrated in FIG. 2) to compute a complex logic function, and each input signal may be latched.

Each latch (304, 312) illustrated in FIG. 3B is a transparent latch triggered on a low clock. That is, as long as the latch clock input CLK is high, the latch data output Q is the same as the latch data input D. On the falling edge of the latch clock input CLK, the latch data input D is latched and remains latched as long as the clock is low. While CK1 (310) is low, the domino logic of stage 1 (300) is in the precharge phase. While stage 1 (300) is in the precharge phase, the stage immediately upstream of stage 1 is in the evaluation phase (CK2 (306) is high). By the end of the evaluation phase of the upstream stage, the output of the upstream stage (316) has stabilized. On the rising edge of CK1 (which is the falling edge of CK2), the stabilized output (316) of the upstream stage is latched by the stage 1 latch (304). Also on the rising edge of CK1, the stage 1 domino logic starts the evaluation phase with stable inputs. On the falling edge of CK1 (which is the rising edge of CK2), the stage 2 latch (312) latches the stabilized output (318) of stage 1 and the stage 1 domino logic starts the precharge phase again.

In FIG. 3B, transistors 320 and 322 and the flush signal 324 provide quiescent current testing as described above in conjunction with FIG. 1B (transistor 116 and flush signal 118). For quiescent current testing, when the flush signal 324 is asserted, each dynamic output node is driven to ground during the evaluation phase for the associated stage. It is important to recall from the discussion of FIG. 2 that only a subset of the storage nodes need to have flush transistors (320 and 322).

In FIG. 3B, the isolation transistors 328, 330 and 332 between stages are optional. The isolation transistors 328, 330 and 332 are necessary only if it is essential to preserve logical states during quiescent current testing. During the evaluation phase of stage 1 (CK1 high), the stage 2 latch 312 is transparent. If during the evaluation phase of stage 1, the storage node 334 logically evaluates to a high level, but instead is pulled low by transistor 320 for quiescent current testing, the stage 2 latch 312 will latch wrong data on the falling edge of CK1. If it is essential to perform quiescent current testing without altering data, each latch (304, 312) must be isolated from its associated upstream output (316, 318) when the associated upstream storage node is undergoing quiescent current testing. Transistors 328, 330 and 332 isolate the latches (304, 312) from associated upstream outputs (316, 318, 336) when the corresponding gate control signals ISO1 (326) and ISO2 (327) are low.

Assume for purposes of illustration that CK1 is slowed or paused after a transition to a high state. Stage 1 (300) is in the evaluation phase. All dynamic nodes must have time to evaluate normally so that all downstream dynamic nodes have evaluated and stabilized before associated latches are isolated. Therefore, ISO2 (327) must wait for a normal evaluation period and then isolate latch 312 before flush 324 is asserted.

FIG. 3C illustrates one embodiment for generating the ISO1 (326) and ISO2 (327) gate control signals. One-shots 340 and 344 are retriggerable one shots, having normally high outputs triggered low on a rising input, and having output pulse times longer than normal clock periods for CK1 (310) and CK2 (306). Therefore, during normal operation (normal clock frequency), the outputs of the one-shots are continuously retriggered low so that ISO1 (326) and ISO2

(327) are always high. Therefore, during normal operation, transistors 328, 330 and 332 (FIG. 3B) are always on.

Assume again for purposes of illustration again that CK1 is slowed or paused for current measurement after a transition to a high state. After a time greater than one normal clock period, one-shot 340 times out and returns to a normally high output, driving ISO2 (327) low. Then, for example, in FIG. 3B, if the flush signal 324 is asserted while CK1 310 is high but after ISO2 (327) is low, then transistor 320 forces node 334 low after latch 312 has latched stable data and is isolated from output 318 by transistor 330. The pulse period of one-shot 340 and 344 needs to be longer than a normal clock period of clock CK1 310 or CK2 312 but short enough to ensure that when CK1 and CK2 are slowed or paused, storage node voltages do not decay significantly before ISO1 or ISO2 isolate downstream latches. While the flush signal is asserted, CK1 310 and CK2 306 may be paused indefinitely for current measurement.

FIG. 3D is a timing diagram illustrating analysis associated with FIGS. 3B–3C. In FIG. 3D, when clock CK1 (310) is low, stage 1 (output waveform—FIG. 3D, 318) is in the precharge phase and stage 2 (output waveform—FIG. 3D, 336) is in the evaluate phase. On the falling edge of CK1 (time T1 (340), T3 (344) and T11 (360)), the stage 2 latch (output waveform—FIG. 3D, 338) latches its input.

At time T3 (352), CK1 (310) and CK2 (306) are paused for current measurement. At time T4 (346), ISO1 (326) goes low after failing to be retriggered by CK2 (310), isolating the stage 1 latch input (see FIG. 3B, transistor 328). At time T5 (348), the flush signal 324 is asserted and the stage 2 output 336 is forced high. Between times T5 (348) and T6 (350), a current measurement is made. Note in FIG. 3B that the evaluate transistor 334 is in series with the flush transistor 320 so that when the flush signal 324 is asserted, the flush transistor 320 pulls the dynamic node 334 low only when CK1 (310) is high. Note in FIG. 3D that at time T5 (348) when the flush signal 324 is first asserted, CK1 (310) is low. Therefore, the flush signal 324 does not affect stage 1, which is in an extended precharge phase, during the time of the first current measurement from time T5 (348) to T6 (350). At time T6 (350), the current measurement is complete and the flush signal 324 is returned low. At time T7 (352), CK1 (310) and CK2 (306) are toggled. Note that while the clocks are paused (T3–T7), all nodes are actively driven so that the test time from T5 to T6 may be arbitrarily long (no loss of dynamic state) and the time from the end of testing (T6) until the time the clocks are restarted (T7) can be arbitrarily long. In addition, in FIG. 3D, at time T7, the clocks are illustrated as toggling and immediately pausing again. The clocks could resume normal cycling at time T7 and the second current measurement could be made at some other convenient time later.

At time T7 (352), CK1 (310) and CK2 (306) are paused for a second current measurement. At time T8 (354), ISO2 (327) goes low after failing to be retriggered by CK1 (310), isolating the stage 2 latch (312) input (see FIG. 3B, transistor 330). At time T9 (356), the flush signal is again asserted, forcing the stage 1 output (318) high. During the time from T9 (356) to T10 (358), a second current measurement is made. The state of the stage 2 latch 312 is preserved during the time ISO2 (327) is low from T8 (354) to T11 (360). At T11 (360), latch 312 latches its isolated input on the falling edge of CK1 (310). At time T11 (360), CK1 (310) and CK2 (306) resume the normal operating frequency.

During the first current measurement (T5 (348)–T6 (350)), a single current measurement tests for storage node shorts to ground and output node shorts to $V_{DD}$ in the odd numbered stages and storage node shorts to $V_{DD}$ and Output node shorts to ground in the even numbered stages. The second current measurement (T9 (356)–T10 (358)) tests for storage node shorts to $V_{DD}$ and output node shorts to ground in the odd numbered stages and tests for storage node shorts to ground and output node shorts to $V_{DD}$ in the even numbered stages. Therefore, for the pipelined system illustrated in FIGS. 3A–3D, only two current measurements are needed to test the entire system.

If data preservation is not required, no sequencing of the flush signal 532 relative to the clock is needed. The measurements are performed first with CK1 high and CK2 low and again with the clocks reversed.

Figure 4A:
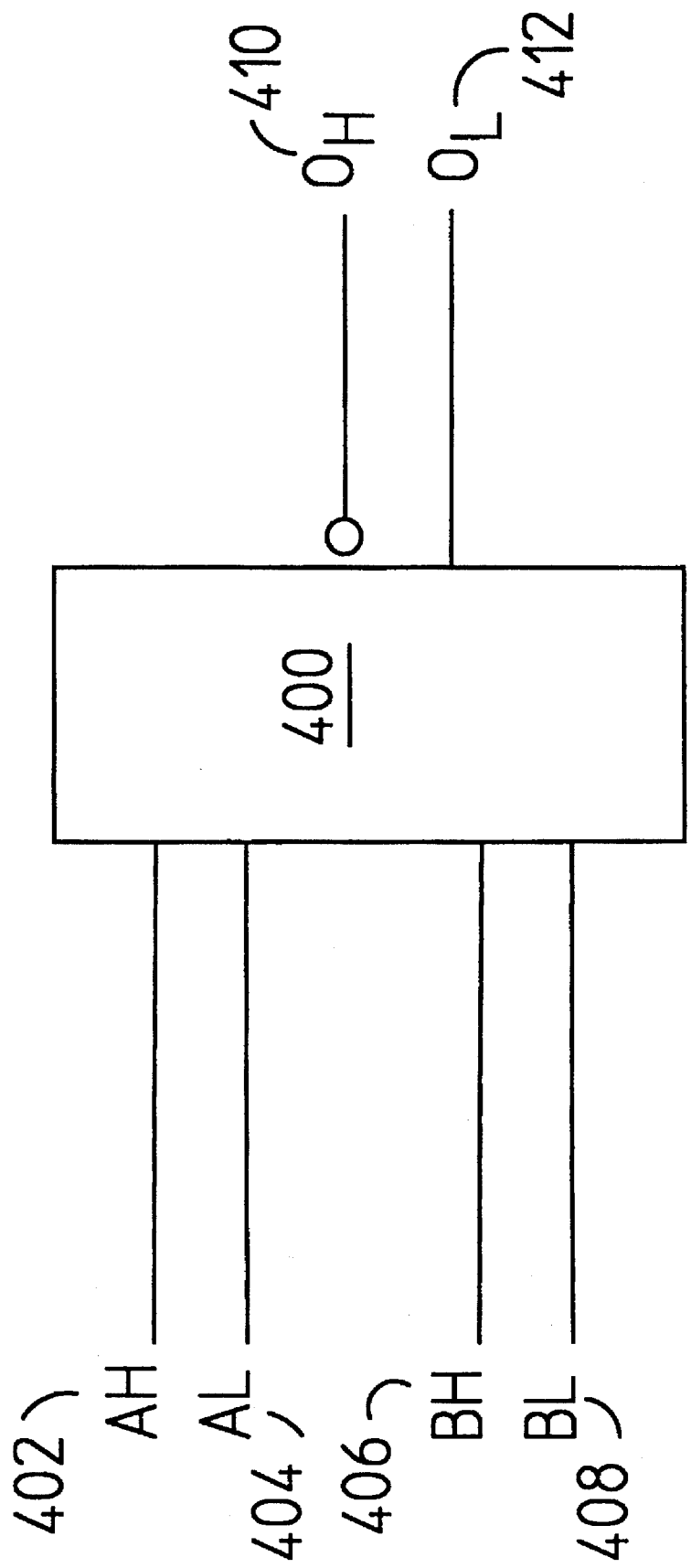
FIG. 4A is a block diagram of a mousetrap logic gate.
Figure 4C:
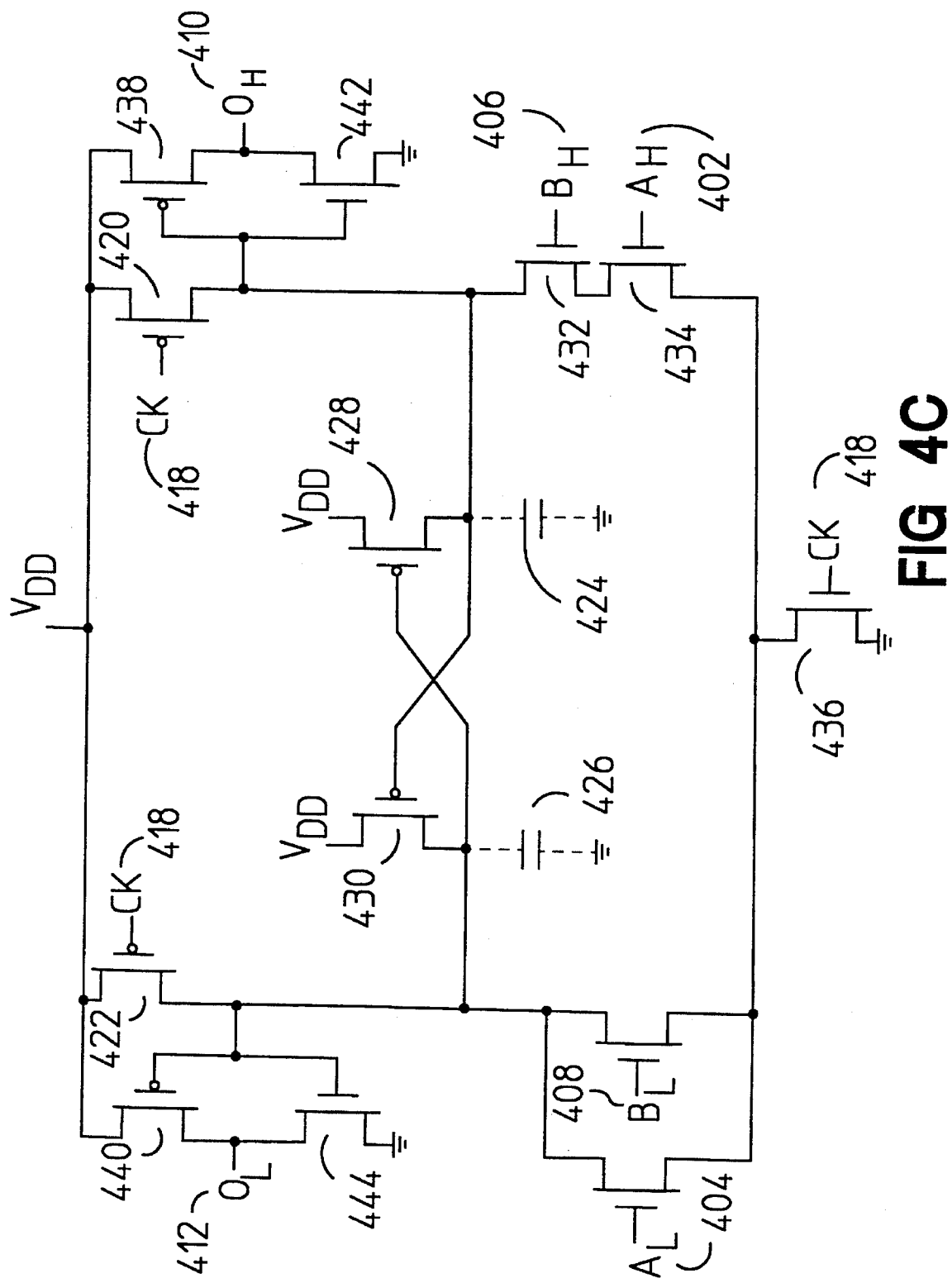
FIG. 4C is a schematic of the mousetrap logic gate of FIG. 4A.

FIGS. 4A–4C illustrate an alternative embodiment of dynamic logic systems. FIG. 4A is a block diagram illustrating a dual-rail or mousetrap dynamic logic gate. Mousetrap gate 400 has a first dual input signal ($A_H$ 402 and $A_L$ 404), a second dual input signal ($B_H$ 406 and $B_L$ 408) and a dual output signal ($O_H$ 410 and $O_L$ 412). FIG. 4B is a table illustrating how a dual signal is logically interpreted. In FIG. 4B, ($X_H$, $X_L$) represents ($A_H$, $A_L$), ($B_H$, $B_L$) or ($O_H$, $O_L$). As illustrated in FIG. 4B, both dual signal lines 414 and 416 are low during the precharge state. During the evaluate state, the two signal lines are logical complements. Having both dual-state signal lines high is an impermissible state. Mousetrap gate outputs remain low (precharge state) until triggered by valid inputs. A mousetrap gate generates a valid output only when it has received a valid input. Logic determination propagates in a monotonic direction from stage to stage in a self-clocking fashion. As a result, within a cascaded group of mousetrap gates, the evaluate phase should be considered as an evaluate and propagate phase.

FIG. 4C illustrates additional detail for an example mousetrap AND gate. FIG. 4C may be analyzed initially by comparing one side to FIG. 1A. Looking first at the "H" side of FIG. 4C, transistor 420 corresponds to the precharge transistor 102 in FIG. 1A. Capacitance 424 in FIG. 4C corresponds to capacitance 104 in FIG. 1A. Transistors 432 and 434 correspond to logic 108 in FIG. 1A. Transistor 436 corresponds to the evaluate transistor 106 in FIG. 1A. Finally, transistors 438 and 442 provide a static inverting buffer corresponding to inverter 114 in FIG. 1A. Note that for the "H" side, both signal $A_H$ (402) AND signal $B_H$ (406) must be HIGH to discharge node capacitor 424 LOW. The "L" side has inverted logic so that both signal $A_L$ (404) AND signal $B_L$ (408) must be LOW to leave node capacitor 426 charged HIGH. Optional transistors 428 and 430 render the gate static after evaluation to prevent charge decay and to provide noise immunity. Both outputs 410 and 412 remain low until triggered by valid inputs. Logic determination propagates in a monotonic direction from stage to stage in a self-clocking (data triggered) fashion by considering only output state transitions from low to high.

FIG. 4D illustrates the circuit of FIG. 4C with additional circuitry for quiescent current testing. If the flush signal 446 is asserted during the evaluation phase (clock CK 418 is high), flush transistors 450 and 452 discharge both node capacitors (424, 426). If optional transistors 428 and 430 are present, transistor 448 prevents transistors 428 and 430 from opposing the capacitor discharge during assertion of the flush signal 446. There are two nodes (454 and 456) which determine the state of the circuit in FIG. 4D. If either node 454 or 456 is shorted or driven to ground during the precharge phase (Clock CK 418 is low) then excessive current will be drawn through transistors 420 or 422. If either node 454 or 456 is shorted or driven to $V_{DD}$ then excessive current will be drawn through transistors 450 or 452 when the flush signal 446 is asserted.

Figure 5:
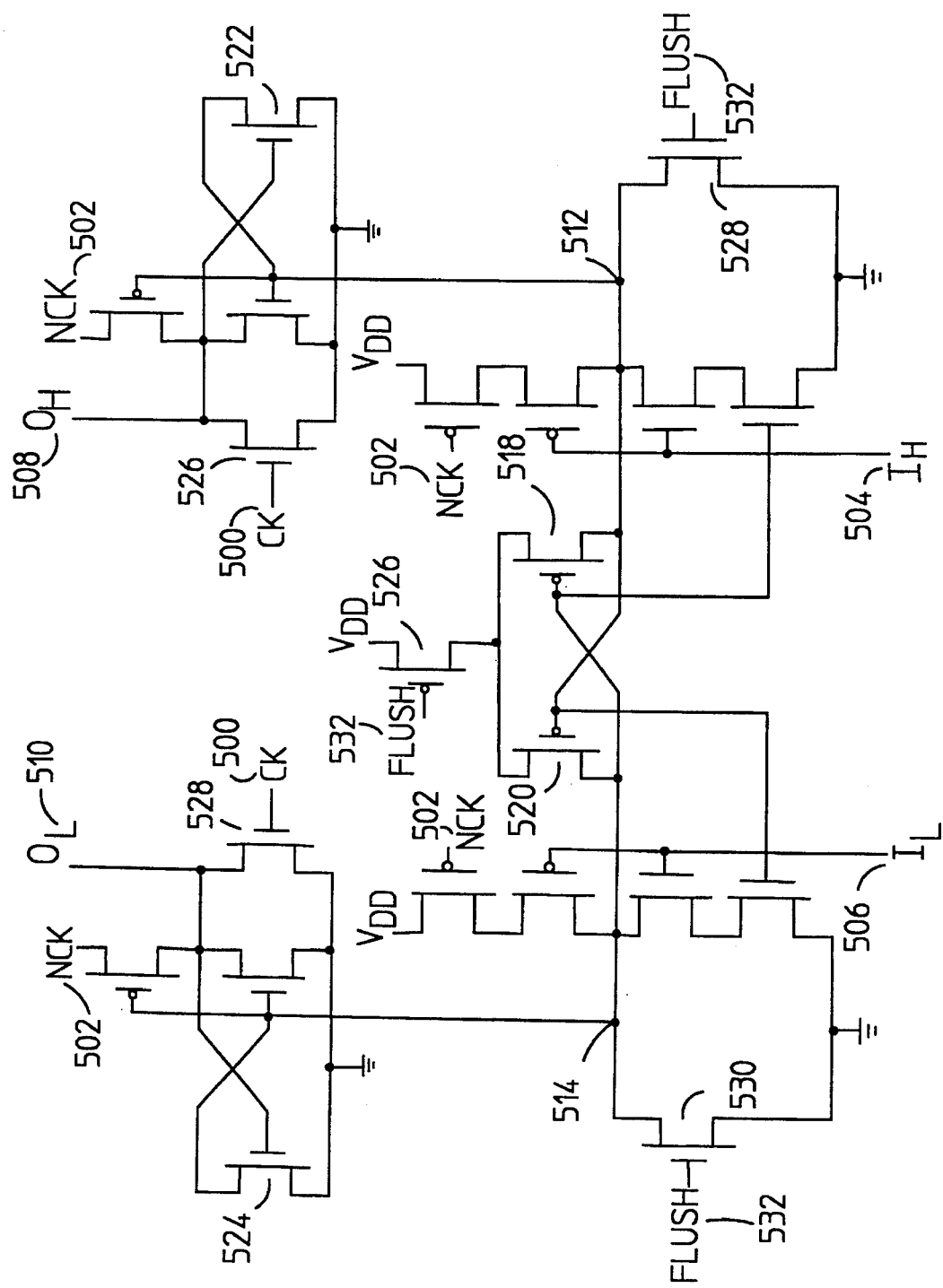
FIG. 5 is a schematic of a static latch suitable for use with mousetrap logic and adapted for quiescent current testing in accordance with the present invention

FIG. 5 illustrates a static latch suitable for use with mousetrap logic in pipelined systems. As illustrated in FIG. 5, the latch has two clocks, CK 500 and NCK 502 where NCK 502 is the logical complement of CK 500. There are dual inputs, $I_H$ 504 and $I_L$ 506 and dual outputs, $O_H$ 508 and $O_L$ 510. Inputs $I_H$ 504 and $I_L$ 506 may be connected to external pipeline inputs or to the outputs of upstream mousetrap logic gates (FIG. 4D, 410 and 412). Outputs $O_H$ 508 and $O_L$ 510 are connected to the inputs of mousetrap logic gates within the same pipeline stage. Internal nodes 512 and 514 define the state of the latch. When both inputs $I_H$ 504 and $I_L$ 506 are low and NCK 502 is low, the latch is reset with internal nodes 512 and 514 both high. Both inputs will be low when the upstream stage is in the precharge phase. While NCK 502 is low, the first input $I_H$ 504 or $I_L$ 506 that goes high will force the corresponding internal node 512 or 514 low and transistors 518 and 520 will latch the state. Note that in contrast to the latches in FIG. 3A (304, 312), which are transparent during one phase and latch on a clock edge, the latch in FIG. 5 is data triggered. That is, latching occurs only when the input signals are valid after a clock edge. The state remains latched until reset (NCK 502 low and both inputs $I_H$ 504 and $I_L$ 506 low). When the circuit of FIG. 5 is latched and NCK 502 is high, both inputs $I_H$ 504 and $I_L$ 506 can go low without affecting the latched state. Once latched, both inputs $I_H$ 504 and $I_L$ 506 can go high without affecting the latched state. When CK 500 is high, transistors 526 and 528 drive both outputs $O_H$ 508 and $O_L$ 510 low. When CK 500 is low, outputs $O_H$ 508 and $O_L$ 510 are the inverse of internal nodes 512 and 514 respectively.

In FIG. 5, transistors 526, 528 and 530 along with flush signal 532 provide quiescent current testing in a similar manner to that described above for single-rail dynamic circuits. As described above, when both inputs $I_H$ 504 and $I_L$ 506 are low (the upstream stage is in its precharge phase) and NCK 502 is low, the latch is reset with both internal nodes 512 and 514 high. Therefore, when NCK 502 is low, if either internal node 512 or 514 is shorted or pulled to ground then excessive power supply current will be drawn through transistors 526, and 518 or 520. If the flush signal 532 is asserted when NCK 502 is low (but after latching on data as described above), transistors 528 and 530 pull both internal nodes 512 and 514 low, a state which cannot normally occur. When the flush signal 532 is high, transistor 526 prevents transistors 518 and 520 from pulling either internal node high. Therefore, when the flush signal 532 is asserted when NCK 502 is low, if either internal node 512 or 514 is shorted or pulled high, excessive power supply current will be drawn through transistors 528 or 530.

Figure 6A:
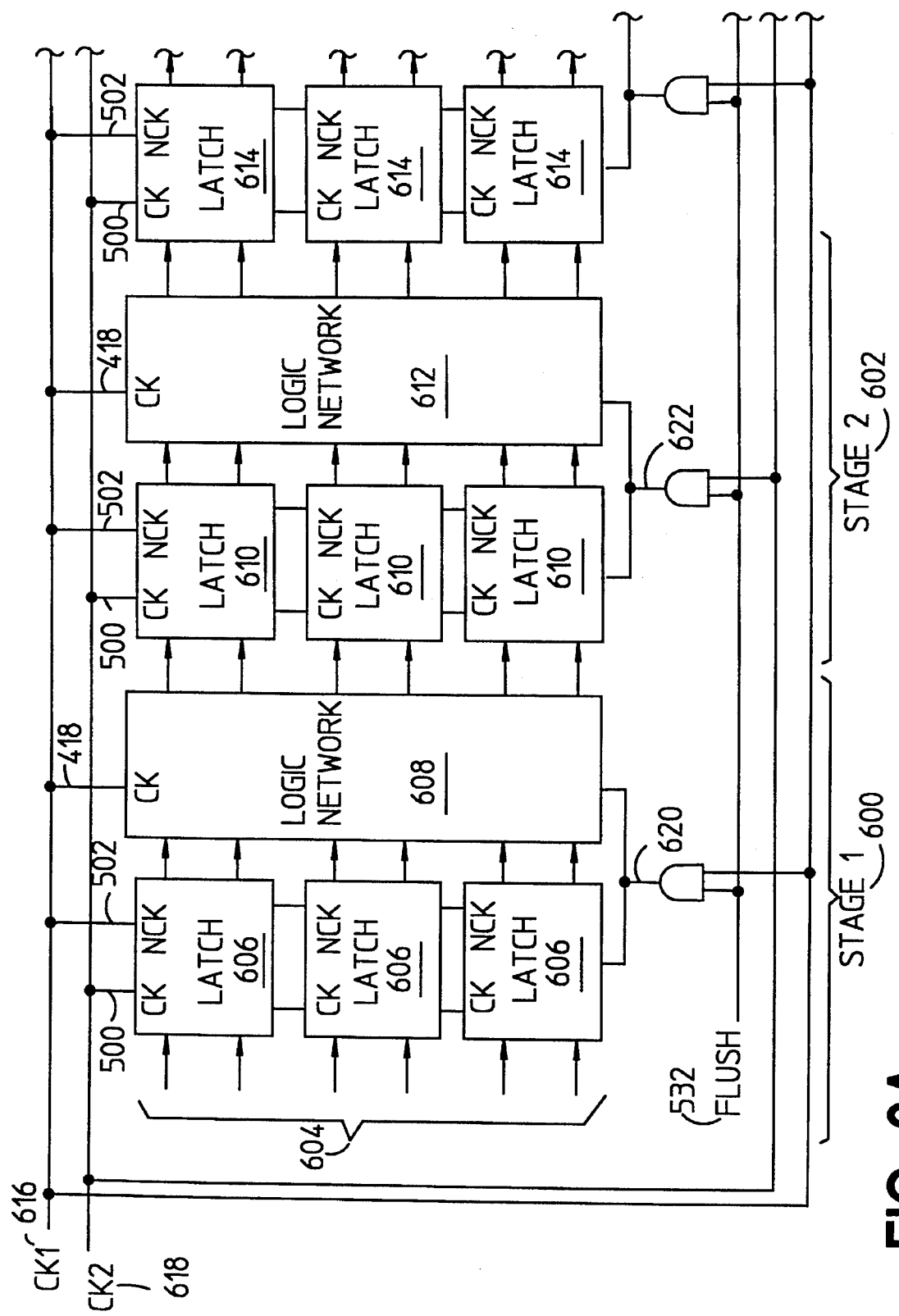
FIG. 6A is a block diagram of a pipelined logic system using mousetrap logic and adapted for quiescent current testing in accordance with the present invention.

FIG. 6A is a block diagram illustration of a pipeline system using mousetrap logic gates as illustrated in FIG. 4D and static latches as illustrated in FIG. 5. In FIG. 6A, two pipelined stages 600 and 602 are illustrated. CK1 616 and CK2 618 are symmetrical and logical complements. Note that the stage 1 logic network 608 is clocked by CK1 (616) and the stage 2 logic network 612 is clocked by CK2 (618) so that stage 1 is in the precharge phase while stage 2 is in the evaluation phase and vice versa. In FIG. 6A, latches preserve the evaluation state of upstream logic while the upstream logic is in the subsequent precharge phase and downstream logic is in the evaluation phase. For example, at the end of an evaluation phase for logic network 608, latches 610 preserve the state of the outputs of logic network 608 while logic network 608 is in the subsequent precharge phase and logic network 612 is in the evaluation phase. Likewise, latches 614 preserve the evaluation state of logic network 612 while logic network 612 is in the subsequent precharge phase.

Referring to FIGS. 4D, 5 and 6A, clock CK in FIG. 4D (418) corresponds to the clock CK inputs for logic networks 608 and 612 in FIG. 6A. Likewise, clock CK (500) and clock NCK (502) in FIG. 5 correspond to clock CK and NCK inputs, respectively, for latches 606, 610 and 614 in FIG. 6A. Note in FIG. 6A, CK for latches 610 and CK for logic 608 are connected to CK1 (616) and NCK for latches 610 is connected to CK2 (618). On the rising edge of CK1 (616), the stage 1 mousetrap logic 608 starts the evaluation phase and the latches 610 for the downstream stage reset (FIG. 5, NCK 502 going low). When the stage 1 mousetrap logic 608 completes evaluation after a short propagation delay, the downstream latches 610 latch on valid data and remain latched through the subsequent precharge phase for the stage 1 mousetrap logic 608. Therefore, the stage 2 latches 610 preserve upstream outputs from logic 608 during the upstream precharge phase and reset for new inputs at the beginning of the upstream evaluation phase.

The flush signal 532 in FIG. 6A is gated so that every other stage is flushed during each cycle of clocks CK1 (616) and CK2 (618). That is, odd numbered stages may be flushed while CK1 (616) is high and even number stages may be flushed while CK2 (618) is high. Referring to FIGS. 5 and 6A, if the clocks are paused with CK1 (616) high, the stage 2 latches 610 initially reset on the rising edge of CK1 (616) and then latch valid data during the evaluation phase of the stage 1 logic network 608. The flush signal 532 may then be asserted while CK1 (616) is paused high, at any time after latching of valid data by latches 610. Note that the stage 1 logic network 608 and the stage 1 latches 606 are flushed simultaneously but only after the stage 1 output data is preserved by the downstream latches 610. Note also that the flush signal 622 for the stage 2 latches 610 is gated with CK2 (618) so that the stage 2 latches 610 are not affected by the flush signal 532 while CK1 (616) is high. The clocks may then be restarted and paused with CK2 (618) high. The stage 2 latches 610 are then flushed at the same time as the stage 2 logic network 612 but only after the downstream latches 614 have preserved the evaluation state of the stage 2 logic network 612.

While CK1 (616) is paused high, one current measurement simultaneously measures storage node shorts to $V_{DD}$ and output node shorts to ground in odd numbered stages (evaluation phase for logic and latched mode for latches in odd numbered stages) and storage node shorts to ground and output node shorts to $V_{DD}$ in even numbered stages (precharge phase for logic in even numbered stages). While CK2 (618) is paused high, a second current measurement measures storage node shorts to $V_{DD}$ and output node shorts to ground in even numbered stages (evaluation phase for logic and latched phase for latches in even numbered stages) and storage node shorts to ground and output node shorts to $V_{DD}$ in odd numbered stages (precharge phase for logic in odd numbered stages). Therefore, only two current measurements are required for complete quiescent current testing and the logical state of the pipelined system is preserved.

Note that for mousetrap latches as illustrated in FIG. 5, which are data triggered rather than clock triggered, isolation transistors between stages (FIG. 3B, 328, 330 and 332) are not needed and flush timing circuits as illustrated in FIGS. 3C and 3D are not needed. For mousetrap logic, the flush signal 532 may be asserted shortly after the leading edge of a clock (after a delay equal to the normal propagation delay sufficient to ensure evaluation and latching) and may be asserted as long as required to make the current measurement. The flush signal 532 must be removed before restarting the clock. If data preservation is not required, no sequencing of the flush signal 532 relative to the clock is needed. The measurements are performed first with CK1 high and CK2 low and again with the clocks reversed.

Figure 6B:
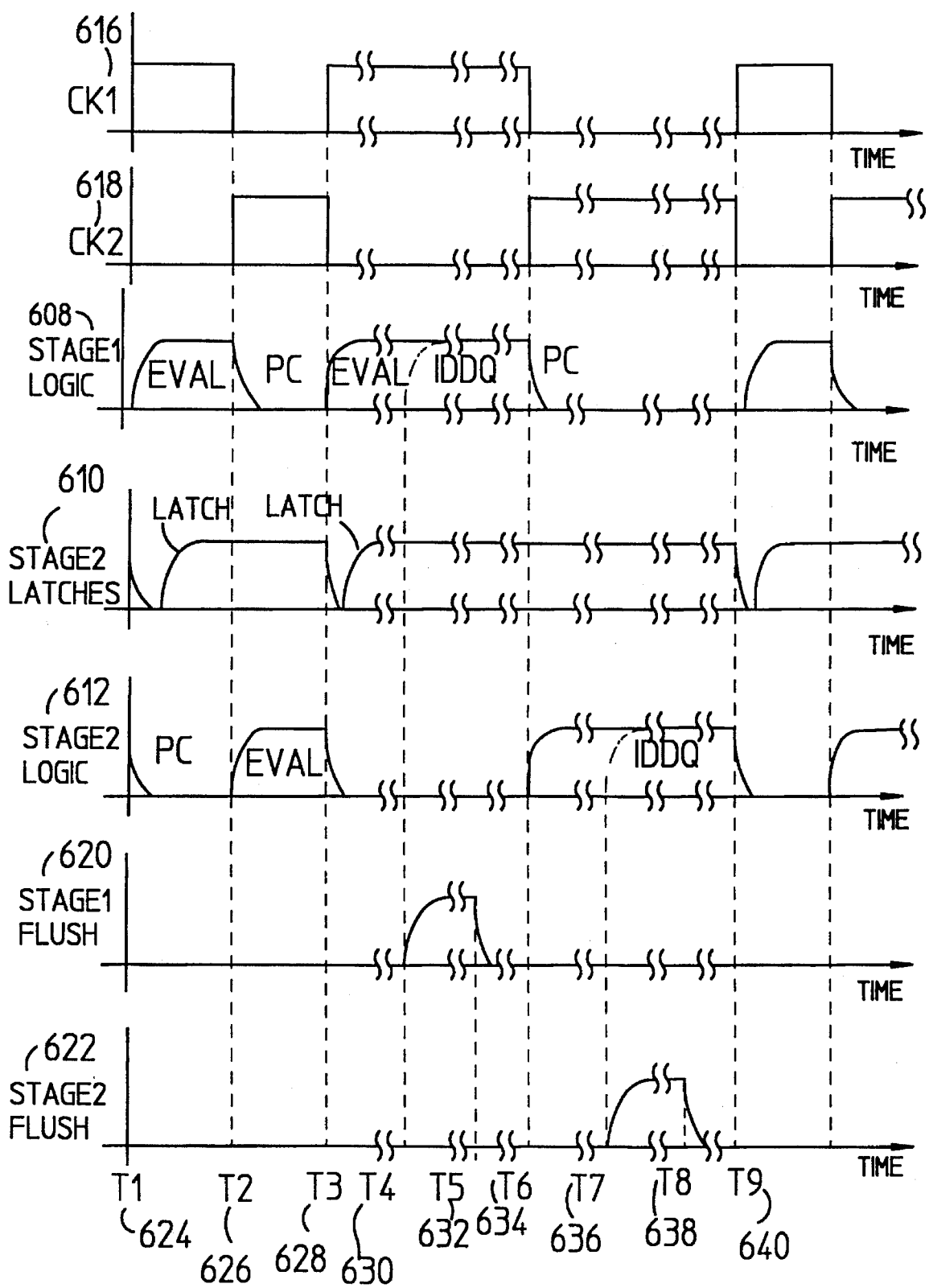
FIG. 6B is a timing diagram for the pipelined logic system illustrated in FIG. 6A.

The timing discussion above is further illustrated in FIG. 6B. As illustrated in FIG. 6B, at T1 (624), on the rising edge of CK1 (616), the stage 2 latches (610) reset. The stage 1 logic (608) enters the evaluation stage and after a short propagation delay, the stage 2 latches (610) latch on stage 1 logic data. The stage 2 latches (610) remain latched until the next rising edge of CK1 (616) at T3 (628). At T2 (626), on the rising edge of CK2 (618), the stage 3 latches (not illustrated) reset. The stage 2 logic (612) enters the evaluation stage and after a short propagation delay, the stage 3 latches latch on stage 2 logic data. At T3 (628), CK1 (616) and CK2 (618) are paused with CK1 (616) high. After a sufficient delay for propagation and latching, the flush signal for stage 1 (620) is asserted at T4 (630). The flush signal remains asserted for as long as necessary to complete a current measurement and is then removed at T5 (632). At T6 (634), CK1 (616) and CK2 (618) are paused with CK2 (618) high. After a sufficient delay for propagation and latching, the flush signal for stage 2 (622) is asserted at T7 (636). The flush signal remains asserted for as long as necessary to complete a current measurement and is then removed at T8 (638). At T9 (640), CK1 (616) and CK2 (618) resume normal operating frequency and quiescent current testing is complete with no loss of data.

For simplicity of illustration and discussion, an underlying assumption in all the discussion above is that the polarity of storage node precharge and evaluation is as illustrated in FIG. 1A. Dynamic logic can be also built in a complementary manner so that the storage node is driven low during the precharge phase and is driven high by logic evaluation circuitry during the evaluation phase. Complementary logic can be useful in cascaded series of gates. Dynamic logic can be built using the basic circuit of FIG. 1A but without the static inverter 114. A system using only one circuit type without inverters cannot be cascaded. Cascading may be accomplished, however, by constructing every other stage using complementary MOS devices. For example, even numbered stages may be constructed so that the storage node is driven high during the precharge phase and driven low by nMOS logic circuitry during the evaluation phase and odd numbered stages may be constructed so that the storage node is driven low during the precharge phase and driven high by pMOS logic circuitry during the evaluation phase. Dynamic logic constructed with alternating stages of complementary logic in this manner is sometimes called zipper logic. Flush transistors for current testing may also be used in zipper logic. The primary design criteria is that during the evaluation phase, the flush transistor must drive a storage node to a voltage level that is opposite the voltage level driven during the precharge phase. For example, if the storage node is driven low during the precharge phase, the flush transistor for current testing must drive the storage node high during the evaluation phase.

Figure 7:
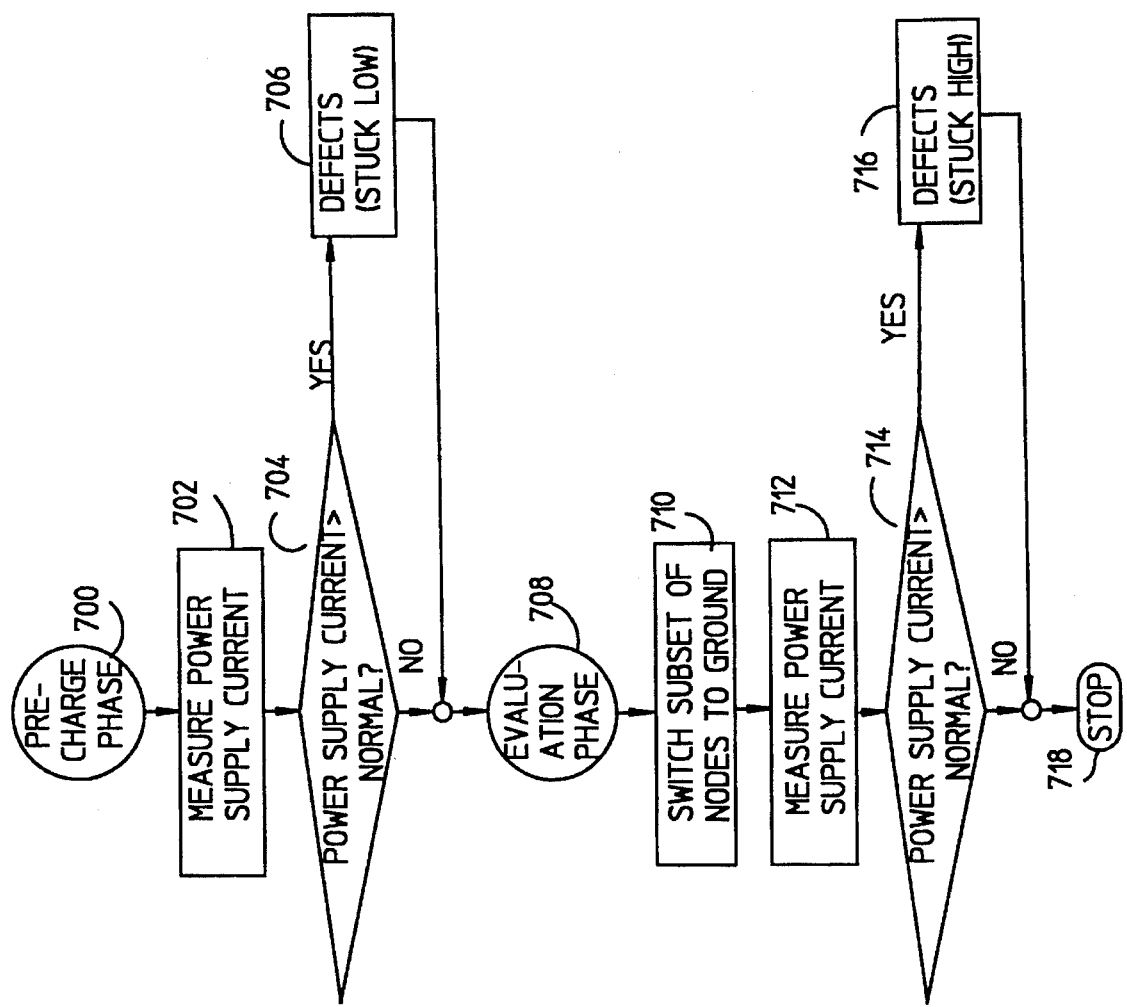
FIG. 7 is a flow chart of a method for testing for node faults in a single stage logic system.

FIG. 7 is a flow chart illustrating the method of testing for node faults in single stage domino dynamic logic. In FIG. 7, the words "low", "high" and "ground" assume logic as illustrated in FIG. 1B but it should be noted from the discussion of zipper logic above that the opposite polarity may be required in some systems. Also, FIG. 7 starts in the precharge phase (700) but testing can start just as easily in the evaluation phase (708). In FIG. 7, the system enters the precharge phase (700) and the power supply current is measured (702). The power supply current is compared to normal (704) and if greater than normal, stuck low defects are present (706). The system then enters the evaluation phase (708). A subset of the logical nodes is switched to ground (710) and the power supply current is measured (712) and compared to normal (714). If the power supply current is greater than normal, stuck high defects are present (716).

Figure 8:
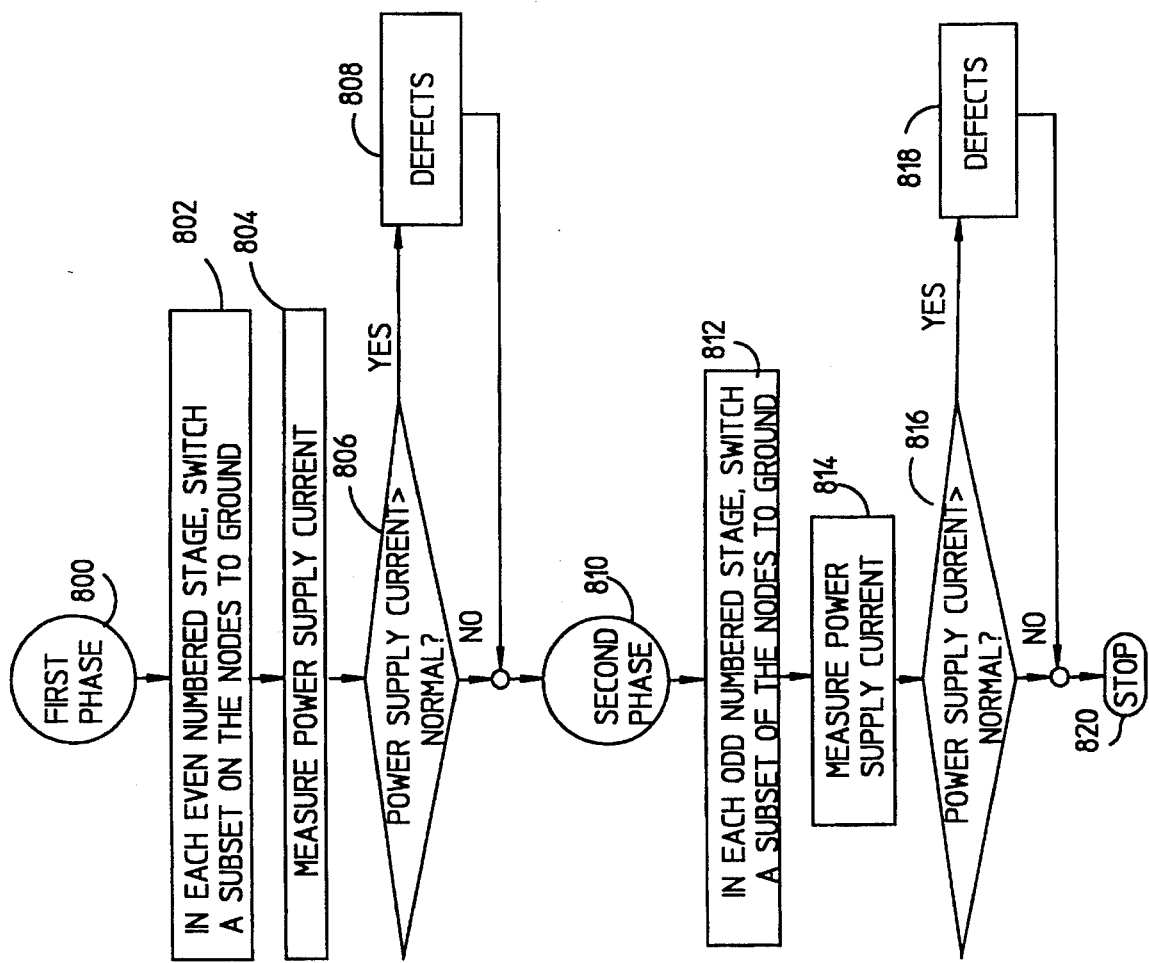
FIG. 8 is a flow chart of a method for testing for node faults in a pipelined system.

FIG. 8 is a flow chart illustrating the method of testing for pipelined systems having multiple stages. In FIG. 8, the association of "first phase" to "even numbered stages" and the association of "second phase" to "odd numbered stages" is arbitrary. The associations, however, must be consistent with timing as discussed in conjunction with FIGS. 3A and 6A. In FIG. 8, the system first enters a first phase (800) and a subset of the nodes in the even numbered stages are switched to ground (802). The power supply current is measured (804) and compared to normal (806). If the power supply current is greater in normal, defects are detected. Recall from the discussion of FIGS. 3A and 6A, for dynamic nodes these defects might be stuck low defects in odd numbered stages or stuck high defects in even numbered stages and for inverted outputs the defects might be stuck high defects in odd numbered stages or stuck low defects in even numbered stages. All these variations of defects are detected in a single power supply current measurement. The system then enters the second phase (810) during which a subset of nodes in the odd numbered stages are switched to ground (812). The power supply current is again measured (814) and compared to normal (816). If the power supply current is greater than normal, defects are detected.

The foregoing description of the present invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. In a logic system having a plurality of dynamic logical nodes, first and second power supply potentials, a power supply current flowing between the first and second power supply potentials, the power supply current having a normal value, a precharge phase during which the dynamic logical nodes are driven to the first power supply potential, an evaluation phase, each of the dynamic logical nodes having associated logic circuitry capable of driving the associated logical node to the second power supply potential during the evaluation phase, a method for detecting defects at the dynamic logical nodes, the method comprising the following steps:

a. actively switching a subset of the dynamic logical nodes to the second power supply potential during the evaluation phase, the subset being sufficient to ensure that all the dynamic logical nodes that are not in the subset are driven to the second power supply potential by the associated logic circuitry;

b. measuring the power supply current during step a;

c. comparing the power supply current measured in step b to the normal value of the power supply current; and d. determining that at least one of the dynamic logical nodes is defective if the power supply current measured in step b is greater than the normal value of the power supply current.

2. The method of claim 1 additionally comprising the following steps:

e. measuring the power supply current during the precharge phase;

f. comparing the power supply current measured in step e to the normal value of the power supply current; and g. determining that at least one of the dynamic logical nodes is defective if the power supply current measured in step e is greater than the normal value of the power supply current.

3. In a logic system having a plurality of dynamic logical nodes, first and second power supply potentials, a power supply current flowing between the first and second power supply potentials, the power supply current having a normal value, a precharge phase during which the dynamic logical nodes are driven to the first power supply potential, and an evaluation phase, a method for detecting defects at the dynamic logical nodes, the method comprising the following steps:

a. actively switching each of the dynamic logical nodes to the second power supply potential during the evaluation phase;

b. measuring the power supply current during step a;

c. comparing the power supply current measured in step b to the normal value of the power supply current; and d. determining that at least one of the dynamic logical nodes is defective if the power supply current measured in step b is greater than the normal value of the power supply current.

4. The method of claim 3 additionally comprising the following steps:

e. measuring the power supply current during the precharge phase;

f. comparing the power supply current measured in step e to the normal value of the power supply current; and g. determining that at least one of the dynamic logical nodes is defective if the power supply current measured in step e is greater than the normal value of the power supply current.

5. In a logic system having first and second dynamic phases, first and second power supply potentials, a power supply current flowing between the first and second power supply potentials, the power supply current having a normal value, a first group of at least one dynamic logic stages, a second group of at least one dynamic logic stages, each of the dynamic logic stages having at least one logical nodes, each of the logical nodes having associated logic circuitry capable of driving the associated logical node to the second power supply potential, a method for detecting defects at the logical nodes, the method comprising the following steps:

a. actively switching a first subset of the logical nodes in the first group of dynamic logic stages to the second power supply potential during the first dynamic phase, the first subset being sufficient to ensure that the logical nodes in the first group of dynamic logic stages that are not in the first subset are driven to the second power supply potential by the associated logic circuitry;

b. measuring the power supply current during step a;

c. comparing the power supply current measured in step b to the normal value of the power supply current; and d. determining that at least one of the logical nodes is defective if the power supply current measured in step b is greater than the normal value of the power supply current.

6. The method of claim 5 additionally comprising the following steps:

e. actively switching a second subset of the logical nodes in the second group of dynamic logic stages to the second power supply potential during the second dynamic phase, the second subset sufficient to ensure that the logical nodes in the second group of dynamic logic stages that are not in the second subset are driven to the second power supply potential by the associated logic circuitry;

f. measuring the power supply current during step e.;

g. comparing the power supply current measured in step f to the normal value of the power supply current; and h. determining that at least one of the logical nodes is defective if the power supply current measured in step f is greater than the normal value of the power supply current.

7. A method as in claim 6 wherein each of the dynamic logic stages has logical inputs, the method further comprising the following step:

i. electrically isolating each of the logical inputs to the dynamic logic stages during steps a and e.

8. In a dynamic logic system having a plurality of logical nodes, first and second power supply potentials, a power supply current flowing between the first and second power supply potentials, the power supply current having a normal value, a precharge phase during which the logical nodes are driven to the first power supply potential, an evaluation phase, each of the logical nodes having associated logic circuitry capable of driving the associated logical node to the second power supply potential during the evaluation phase, a system for detecting defects at the logical nodes, the system comprising:

a conductive path having low impedance to the second power supply potential;

a plurality of switches, each switch associated with one of the logical nodes, the switches being fewer in number than the logical nodes, each switch connected between its associated logical node and the conductive path, all the switches being closed for a time during the evaluation phase, thereby switching the associated logical nodes to the second power supply potential, the switches being sufficient in number to ensure that when the switches are closed the logical nodes without associated switches are driven to the second power supply potential by the associated logic; and an ammeter, connected to measure the power supply current, at least one of the logical nodes being defective if the power supply current during the time the switches are closed is higher than the normal value.

9. The system of claim 8, the conductive path further comprising:

a phase switch providing a low impedance to the second power supply potential when closed, the phase switch closed only during the evaluation phase.

10. In a dynamic logic system having a plurality of logical nodes, first and second power supply potentials, a power supply current flowing between the first and second power supply potentials, the power supply current having a normal value, a precharge phase during which the logical nodes are driven to the first power supply potential, an evaluation phase, each logical node having associated logic circuitry capable of driving the associated logical node to the second power supply potential during the evaluation phase, a system for detecting defects at the logical nodes, the system comprising:

a conductive path having low impedance to the second power supply potential;

a plurality of switches, the switches having a one-to-one correspondence to the logical nodes, each switch connected between its corresponding logical node and the conductive path, all the switches being closed for a time during the evaluation phase, thereby switching all the logical nodes to the second power supply potential; and an ammeter, connected to measure the power supply current, at least one of the logical nodes being defective if the power supply current during the time the switches are closed is higher than the normal value.

11. The system of claim 10, the conductive path further comprising:

a phase switch providing a low impedance to the second power supply potential when closed, the phase switch closed only during the evaluation phase.

12. In a logic system having first and second dynamic phases, first and second power supply potentials, a power supply current flowing between the first and second power supply potentials, the power supply current having a normal value, a first group of at least one dynamic logic stages, a second group of at least one dynamic logic stages, each of the dynamic logic stages having at least one logical nodes, each of the logical nodes having associated logic circuitry capable of driving the associated logical node to the second power supply potential, a system for detecting defects at the logical nodes, the system comprising:

a first conductive path having low impedance to the second power supply potential;

a first plurality of switches, each switch in the first plurality of switches associated with one of the logical nodes in the first group of dynamic logic stages, the switches in the first plurality of switches being fewer in number than the logical nodes in the first group of dynamic logic stages, each switch in the first plurality of switches connected between its associated logical node and the first conductive path, all the first plurality of switches closed for a time during the first dynamic phase, thereby switching the associated logical nodes to the second power supply potential, the switches in the first plurality of switches sufficient in number to ensure that when closed, the logical nodes in the first group of dynamic logic stages without associated switches are driven to the second power supply potential by the associated logic; and an ammeter, connected to measure the power supply current, at least one of the logical nodes being defective if the power supply current during the time the first plurality of switches are closed is higher than the normal value.

13. The system of claim 12, the first conductive path further comprising:

a first phase switch providing a low impedance to the second power supply potential when closed, the first phase switch closed only during the first dynamic phase.

14. The system of claim 12, further comprising:

a second conductive path having low impedance to the second power supply potential;

a second plurality of switches, each switch in the second plurality of switches associated with one of the logical nodes in the second group of dynamic logic stages, the switches in the second plurality of switches being fewer in number than the logical nodes in the second group of dynamic logic stages, each switch in the second plurality of switches connected between its associated logical node and the second conductive path, all the second plurality of switches being closed for a time during the second dynamic phase, thereby switching the associated logical nodes to the second power supply potential, the switches in the second plurality of switches sufficient in number to ensure that when closed, the logical nodes in the second group of dynamic logic stages without associated switches are driven to the second power supply potential by the associated logic; and at least one of the logical nodes being defective if the power supply current during the time the second plurality of switches are closed is higher than the normal value.

15. The system of claim 14, further comprising:

a first phase switch providing a low impedance from the first conductive path to the second power supply potential when closed, the first phase switch closed only during the first dynamic phase; and a second phase switch providing a low impedance from the second conductive path to the second power supply potential when closed, the second phase switch closed only during the second dynamic phase.

16. The system of claim 14 further comprising:

the dynamic logic stages connected sequentially, each of the dynamic logic stages having inputs and latched outputs, each latched output for each of the dynamic logic stages except the last dynamic logic stage associated with corresponding inputs to the next sequential dynamic logic stage;

a third plurality of switches, the third plurality of switches being normally closed, the third plurality of switches having a one-to-one correspondence to the latched outputs, each switch in the third plurality of switches connected between its corresponding latched output and the inputs to the next sequential dynamic logic stage associated with the corresponding latched output; and the third plurality of switches being open when the first plurality of switches are closed and when the second plurality of switches are closed, thereby isolating the inputs to the dynamic logic stages during detection of faults.

17. In a logic system having first and second dynamic phases, first and second power supply potentials, a power supply current flowing between the first and second power supply potentials, the power supply current having a normal value, a first group of at least one dynamic logic stages, a second group of at least one dynamic logic stages, each of the dynamic logic stages having a plurality of mousetrap logic gates, each of the mousetrap logic gates having at least two logical nodes, each logical node having associated logic circuitry capable of driving the associated logical node to the second power supply potential, a system for detecting defects at the logical nodes, the system comprising:

a first conductive path having low impedance to the second power supply potential;

a first plurality of switches, each switch in the first plurality of switches associated with one of the logical nodes in the first group of dynamic logic stages, the switches in the first plurality of switches being fewer in number than the logical nodes in the first group of dynamic logic stages, each switch in the first plurality of switches being connected between its associated logical node and the first conductive path, all the first plurality of switches closed for a time during the first dynamic phase, thereby switching the associated logical nodes to the second power supply potential, the switches in the first plurality of switches sufficient in number to ensure that when closed, the logical nodes in the first group of dynamic logic stages without associated switches are driven to the second power supply potential by the associated logic; and an ammeter, connected to measure the power supply current, at least one of the logical nodes being defective if the power supply current during the time the first plurality of switches are closed is higher than the normal value.

18. The system of claim 17, further comprising:

a second conductive path having low impedance to the second power supply potential;

a second plurality of switches, each switch in the second plurality of switches associated with one of logical nodes in the second group of dynamic logic stages, the switches in the second plurality of switches being fewer in number than the logical nodes in the second group of dynamic logic stages, each switch in the second plurality of switches being connected between its associated logical node and the second conductive path, all the second plurality of switches closed for a time during the second dynamic phase, thereby switching the associated logical nodes to the second power supply potential, the switches in the second plurality of switches sufficient in number to ensure that when closed, the logical nodes in the second group of dynamic logic stages without associated switches are driven to the second power supply potential by the associated logic; and at least one of the logical nodes being defective if the power supply current during the time the second plurality of switches are closed is higher than the normal value.

19. In a logic system having a plurality of dynamic logical nodes, a method of testing the dynamic logical nodes, the method comprising the following steps:

a. precharging to a first logical state, during a first phase, a subset of the dynamic logical nodes;

b. setting to a second logical state, during a second phase, the subset of the dynamic logical nodes, the second logical state logically opposite from the first logical state;

c. measuring a power supply current during step b;

d. comparing the power supply current measured in step b to a normal value of the power supply current; and e. determining that at least one of the dynamic logical nodes is defective if the power supply current measured in step b is greater than the normal value of the power supply current.

* * * * *